United States Patent [19]

Hinds et al.

[11] 4,355,719
[45] Oct. 26, 1982

[54] MECHANICAL SHOCK AND IMPACT RESISTANT CERAMIC SEMICONDUCTOR PACKAGE AND METHOD OF MAKING THE SAME

[75] Inventors: Sally K. Hinds, Santa Clara; Peter M. Weiler, Palo Alto; Robert R. Hewitt, Sunnyvale, all of Calif.

[73] Assignee: National Semiconductor Corporation, Santa Clara, Calif.

[21] Appl. No.: 179,146

[22] Filed: Aug. 18, 1980

[51] Int. Cl.³ .................. B65D 85/30; H05F 3/02; H05K 5/00; H05K 3/00

[52] U.S. Cl. .................. 206/334; 206/593; 174/52 PE; 357/72; 357/74; 357/80; 29/588

[58] Field of Search .............. 206/334, 331, 332, 328, 206/593; 220/69; 174/52 PE, 52 FP; 357/80, 74, 72; 29/588

[56] References Cited

U.S. PATENT DOCUMENTS

| 2,939,058 | 5/1960 | Masterson | 357/72 |
| 2,951,612 | 9/1960 | Salzenbrodt | 220/69 |
| 3,435,949 | 4/1969 | Suverkropp | 206/332 |
| 3,489,845 | 1/1970 | Landron | 357/80 |
| 3,617,819 | 12/1971 | Boisvert et al. | 357/74 |
| 3,735,209 | 5/1973 | Saddler | 357/74 |
| 3,793,474 | 2/1974 | Dunn et al. | 174/52 PE |
| 3,877,065 | 4/1975 | Vladik | 357/80 |
| 4,037,267 | 7/1977 | Klsor | 206/331 |
| 4,107,555 | 8/1978 | Haas et al. | 357/74 |
| 4,171,049 | 10/1979 | Nohara et al. | 206/334 |

Primary Examiner—William T. Dixson, Jr.
Attorney, Agent, or Firm—Gail W. Woodward; James A. Sheridan; Neil B. Schulte

[57] ABSTRACT

A mechanical shock and impact resistant ceramic semiconductor package is formed by applying a resilient, non-conductive, non-absorbent, heat-resistant material onto the surfaces of said package. In a dual in-line ceramic package a silicone polymer is discretely applied onto at least one end of the longitudinally opposite end edge surfaces. This renders the package mechanical shock and impact resistant.

9 Claims, 3 Drawing Figures

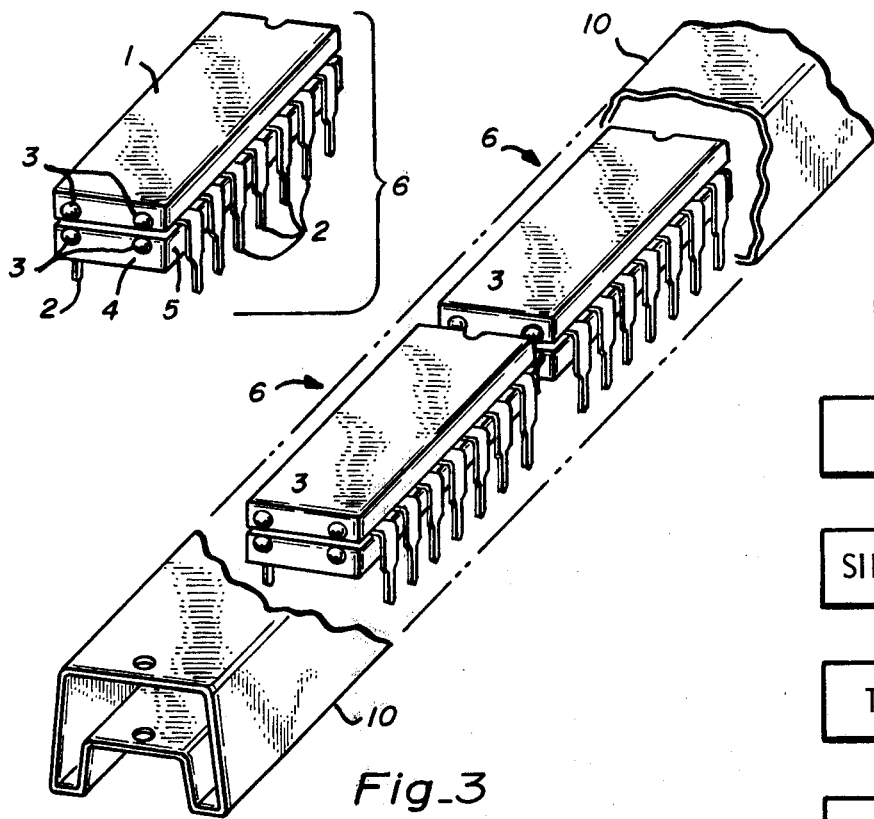
Fig_1
Fig_3
Fig_2
TYPICAL FLOW OF OPERATIONS
CONDUCTED ON A CERAMIC PACKAGE

MECHANICAL SHOCK AND IMPACT RESISTANT CERAMIC SEMICONDUCTOR PACKAGE AND METHOD OF MAKING THE SAME

BACKGROUND OF THE INVENTION

This invention relates generally to the manufacture of semiconductor devices and, in particular, to the assembly operation of semiconductor IC chips packaged in ceramic packages.

Semiconductor IC chips are packaged or assembled in several types of packages. Ceramic packages are commonly used. A typical ceramic package used to support semiconductor chips is the dual-in-line package which comprises of a rectangular-shaped ceramic body having metallic leads extending from either edge parallel to the axial direction. A frequent problem encountered with ceramic packages is the damage caused by chipping and cracking of the ceramic parts owing to their brittleness. This problem is more pronounced with larger packages owing to their greater weight. This results in significant losses because of rejection of such devices. A few of the post-assembly operations of ceramic packages involve steps of testing, lead-straightening, trimming, carrier-loading, prepacking, shipping, and the like besides P.C. board insertion. All of these operations subject semiconductor devices assembled in ceramic packages to conditions of mechanical shock and impact which invariably result in an undesirable chipping and/or breakage of some components. The prior art has not adequately addressed this problem.

SUMMARY OF THE INVENTION

The present invention renders semiconductor devices assembled in ceramic packages mechanical shock and impact resistant. A coating of a material that is resilient is applied on the surfaces of the package in order to absorb any mechanical shock or impact to which the package might be subjected. In order that the assembled ceramic package be capable of withstanding the environmental conditions to which the package would be subjected, the coating material needs also to be heat-resistant, non-absorbent and non-conductive. Preferably, a silicone polymer discretely applied onto at least one of the longitudinally opposite ends of a dual-in-line ceramic package renders the package mechanical shock and impact resistant.

BRIEF DESCRIPTION OF THE DRAWINGS

FIG. 1 is an isometric perspective view of a typical ceramic dual-in-line package having a discretely applied resilient coating.

FIG. 2 is a flow-chart of some of the typical operations conducted on a ceramic package.

FIG. 3 shows a section of a carrier-tube used for carrying packages post-assembly.

DETAILED DESCRIPTION

FIG. 1 shows an isometric perspective view of a typical ceramic dual-in-line package 6 having a semiconductor IC chip mounted within it. The semiconductor chip is internally connected to the leads 2 which extend outward from the package.

This invention relates to the rendering of such and other ceramic packages mechanical shock and impact resistant. Examples of ceramic packages other than dual-in-line packages would be single-in-line packages, flatpacks, chip-carriers, and the like.

FIG. 2 shows a typical flow of some of the operation conducted on an assembled ceramic package. FIG. 3 shows a cut away section of a typical carrier tube 10 in which ceramic packages are carried post-assembly. Tube 10 is typically about 2 ft. long and made of transparent insulating material. It is apparent that the packages bump against one another on their longitudinal ends whilst in these tubes. Such bumping can result from loading, unloading or transferring devices into and out of tubes. It can also occur while the tube is being manipulated during normal manufacturing such as testing, marking, conditioning, inventorying and the like. A significant number of packages are rejected owing to packages being damaged from this type of mechanical shock and impact.

FIG. 1 shows the end-edge surface region 4 adjacent to edge surface region 5 from where the leads 2 extend outwardly. Edge surface 4 is coated with a resilient coating bumps 3, thereby rendering the package mechanical shock and impact resistant. In the preferred embodiment, as shown, the coating 3 is discretely applied. However, this need not be so. Coating 3 may be applied uniformly across surface 4. Also, it may additionally be applied on surface 1 and/or 5. In the preferred embodiment it is discretely applied in the form of bumps onto the longitudinally opposite end edge 4 of the dual-in-line package 6. This has been found to be adequate, particularly where handling tubes are employed, and is done as a matter of convenience and cost-savings. Functionally, a uniformly applied coating would perform just as well in substantially decreasing the number of packages damaged during post-assembly handling.

Assembled devices typically undergo a significant number of tests. Some of these tests are conducted at elevated temperatures. I is therefore essential that the coating material be heat resistant besides being resilient. In the preferred embodiment it is necessary that the material withstand temperatures of around 300° C. FIG. 2 shows a typical flow of some of the operations conducted on an assembled ceramic package.

Ceramic packages, as distinct from plastic packages, are considered to be hermetic. This requires that the ceramic packages be tested for hermeticity. A typical hermeticity test involves subjecting the package to an inert gas like helium or krypton at a high pressure and subsequently transferring the package to a low-pressure environment and detecting for the release of any gaseous material that would have creeped into the package during the higher pressure exposure had there been any leaks. This type of test requires that the coating material also be non-absorbent. If it were absorbent, it could release absorbed gas in the above test and lead to erroneous determinations of hermeticity.

It is also preferred that the material be non-conductive as it is conceivable that surfaces 5 may accidentally get coated. It is also contemplated that surfaces 5 may be intentionally coated. The presence of leads 2 at surfaces 5 requires that any such coating on surfaces 5 be non-conductive in order to prevent shorting between leads. A non-conductive coating on surfaces 4 would also be required to avoid shorting on printed circuit boards or other IC device carrier substrates where the coating may come into contact with other circuit current carrying devices.

In the preferred embodiment a silicone polymer is used. Other materials that are heat-resistant, non-conductive, non-absorbent, and resilient may be used. In particular, in the preferred embodiment, Dow Corning's R-6102 semiconductor junction coating is used. This may be cured at the conditions prescribed by the manufacturer or any other conditions sintable to a manufacturing process. A typical cure cycle would be one hour at 70° C. followed by two hours at 150° C.

In the preferred embodiment the silicon polymer is applied by dispensing droplets 3 of the uncured polymer onto at least one of the longitudinally opposite end edge surfaces 4 of the dual-in-line ceramic packages. The droplets 3 are then cured by adequately heating the material. Other application techniques may be used. Examples of these would be brushing, spraying, silk-screening, dipping, and the like.

Having thus described the invention it is conceivable that one skilled in the art may make several changes and modifications without departing from the teachings and scope of this invention.

What is claimed is:

1. In a ceramic package, adapted to hermetically house an electronic device, which is to be handled in plural numbers pursuant to testing and using wherein such handling may act to impact the devices and thereby chip said ceramic, the improvement comprising:

coating means comprising a non-conductive, heat-resistant, non-absorbent, resilient material located on said package to render it resistant to mechanical shock and impact, whereby the incidence of chipping is reduced or eliminated.

2. The device of claim 1 wherein said means comprises:

a non-conductive, heat-resistant, non-absorbent, resilient material applied onto at least one of the longitudinal opposite end edge surface of said package.

3. The device of claim 1 wherein said coating means comprise:

a silicone polymer applied onto a surface of said package.

4. The device of claim 3 wherein said package is a dual-in-line package and said polymer is applied onto at least one of the longitudinally opposite end edge surfaces of said package.

5. The device of claim 4 wherein said polymer is discretely applied onto at least one of said longitudinally opposite end edge surfaces of said package.

6. An improved method of manufacturing an electronic device in a hermetically sealed ceramic package, wherein said package is to be handled in plural numbers pursuant to testing and using and wherein such handling may act to impact the devices and thereby chip said ceramic, said improved method comprising:

applying a coating comprising a non-conductive, heat-resistant, non-absorbent, resilient material to said package to render it resistant to mechanical shock and impact whereby the incidence of chipping is reduced or eliminated.

7. The method of claim 6 wherein said improvement comprises:

applying a silicone polymer onto the longitudinal end edge surface of said package.

8. The method of claim 7 wherein said package is a dual-in-line package and said polymer is applied onto at least one of the longitudinal end edge surfaces of said dual-in-line package.

9. The method of claim 8 wherein said polymer is discretely applied onto at least one of said longitudinal end edge surfaces of said dual-in-line package.

* * * * *